United States Patent
Wei et al.

(10) Patent No.: US 11,304,312 B2
(45) Date of Patent: Apr. 12, 2022

(54) METHOD FOR MANUFACTURING A CIRCUIT BOARD

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventors: Hao-Yi Wei, New Taipei (TW); Yan-Lu Li, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 43 days.

(21) Appl. No.: 16/887,473

(22) Filed: May 29, 2020

(65) Prior Publication Data
US 2021/0368633 A1 Nov. 25, 2021

(30) Foreign Application Priority Data
May 25, 2020 (CN) .......................... 202010450748.7

(51) Int. Cl.
*H05K 3/46* (2006.01)
*H05K 1/02* (2006.01)
*H05K 3/28* (2006.01)

(52) U.S. Cl.
CPC ......... *H05K 3/4644* (2013.01); *H05K 1/0218* (2013.01); *H05K 3/28* (2013.01); *H05K 2201/0715* (2013.01)

(58) Field of Classification Search
CPC ...... H05K 3/4644; H05K 3/28; H05K 1/0218; H05K 2201/0715
USPC ........................................ 29/829, 825, 592.1
See application file for complete search history.

(56) References Cited

U.S. PATENT DOCUMENTS

| | | | |
|---|---|---|---|
| 6,262,895 B1 * | 7/2001 | Forthun | H01L 23/4985 257/707 |
| 9,532,466 B2 * | 12/2016 | Lee | H05K 3/4652 |
| 2002/0164838 A1 * | 11/2002 | Moon | H01L 25/105 438/107 |
| 2003/0067064 A1 * | 4/2003 | Kim | H01L 23/3114 257/686 |

(Continued)

*Primary Examiner* — Peter Dungba Vo
*Assistant Examiner* — Azm A Parvez
(74) *Attorney, Agent, or Firm* — ScienBiziP, P.C.

(57) ABSTRACT

A method for manufacturing a circuit board comprises: a first single-sided board and an insulating structure are provided. The first single-sided board is pressed to the insulating structure and covers opposite side surfaces of the insulating structure to form a first laminated board. A second single-sided board and a third single-sided board are provided. The second single-sided board is pressed to the third single-sided board and covers opposite side walls of the third single-sided board to form a second laminated board. An inner wiring layer is formed by the second laminated board. The second laminated board with the inner wiring layer and the first laminated board are pressed to form an intermediate structure. Outer wiring layers are formed by the intermediate structure. Covering films are formed on surfaces of the outer wiring layers. Electromagnetic interference shielding layers are formed on the covering films.

7 Claims, 15 Drawing Sheets

(56) References Cited

U.S. PATENT DOCUMENTS

2006/0049495 A1* 3/2006 Hazeyama ............ H01L 25/105
257/678

* cited by examiner

METHOD FOR MANUFACTURING A CIRCUIT BOARD

FIELD

The subject matter herein generally relates to a circuit board, especially relates to a method for manufacturing the circuit board.

BACKGROUND

In response to high-frequency high-speed and MIMO (multiple input multiple output) technology and other upgrade requirements, 5G antennas are widely used in 5G smart phones and other electronic products that require high frequency and high speed. Therefore, how to further improve the anti-interference ability of the signals of electronic products is an urgent problem to be solved.

BRIEF DESCRIPTION OF THE DRAWINGS

Implementations of the present disclosure will now be described, by way of embodiments, with reference to the attached figures.

DETAILED DESCRIPTION

Figure 1:
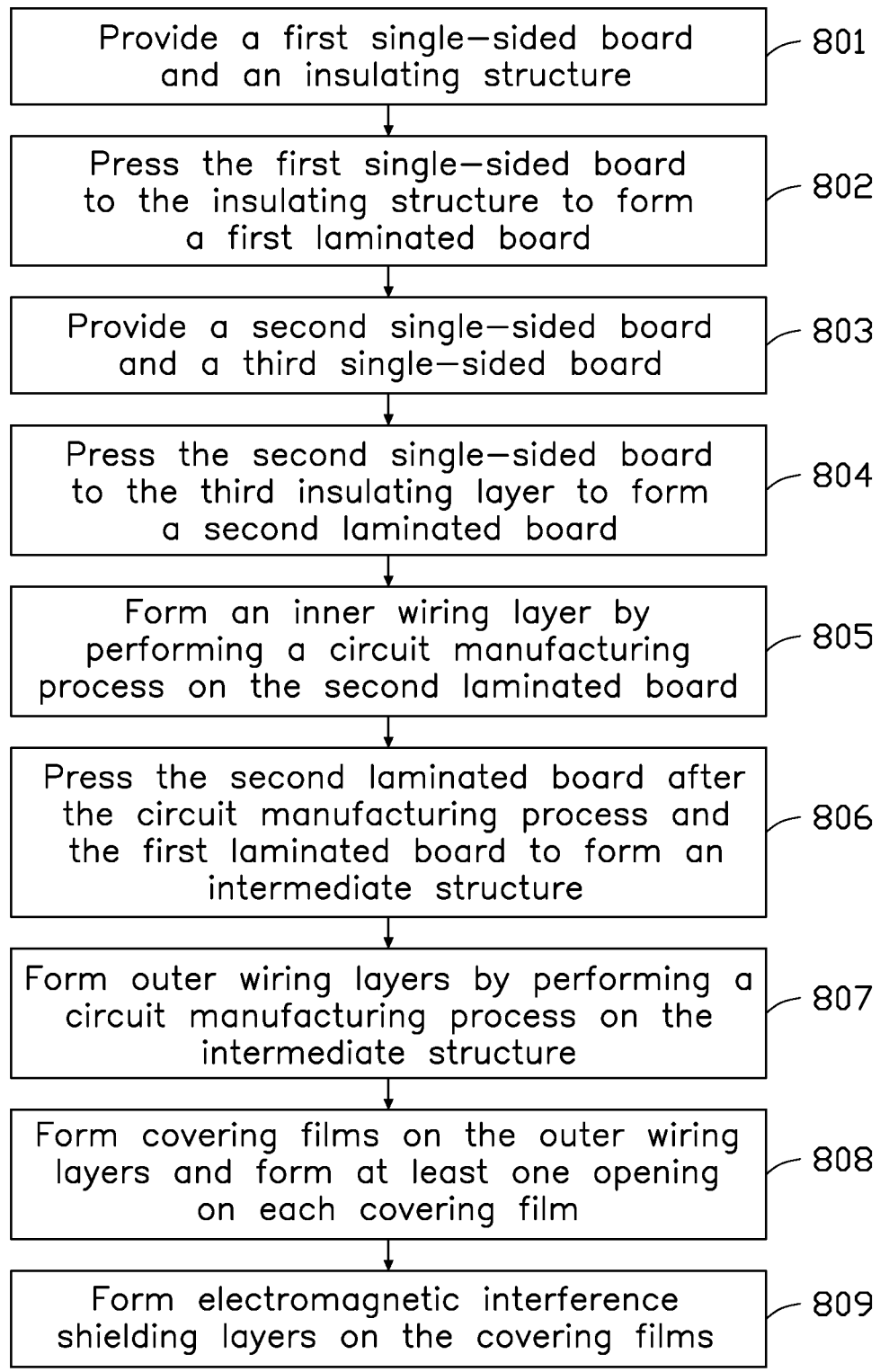
FIG. 1 is a flowchart of a first embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with a first embodiment. The method for manufacturing a circuit board (shown in FIG. 10) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 801.

Figure 2:
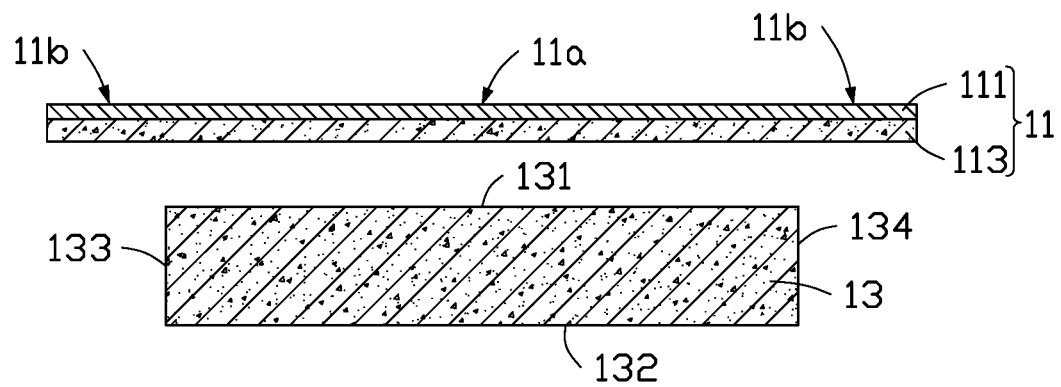
FIG. 2 is a cross-sectional view of an embodiment of a first single-sided board and an insulating structure.

At block 801, referring to FIG. 2, a first single-sided board 11 and an insulating structure 13 are provided. The first single-sided board 11 is divided into a first base region 11a and first folding regions 11b connecting opposite sides of the first base region 11a. The insulating structure 13 corresponds to the first base region 11a.

In at least one embodiment, the first single-sided board 11 includes a first metal layer 111 and a first insulating layer 113 stacked on the first metal layer 111.

The first insulating structure 13 includes a first surface 131, a second surface 132 facing away from the first surface 131, two side surfaces 133 and 134 opposite to each other. Each of the side surfaces 133 and 134 is connected to the first surface 131 and the second surface 132.

In at least one embodiment, a thickness of the first single-sided board 11 is less than a thickness of the insulating structure 13.

Figure 3:
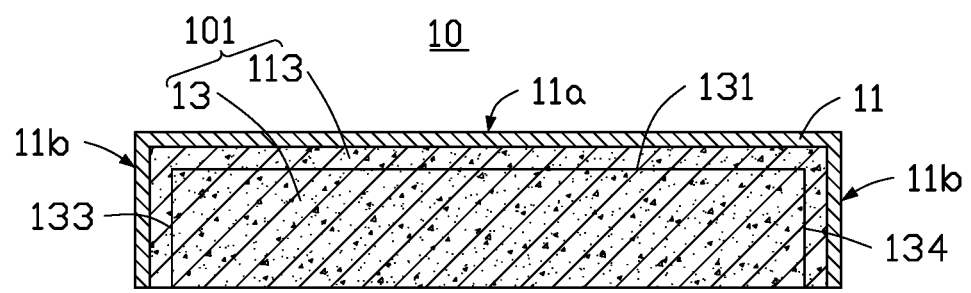
FIG. 3 is a cross-sectional view showing a first laminated board formed by the first single-sided board and the insulating structure of FIG. 2.

At block 802, referring to FIG. 3, the first single-sided board 11 is pressed to the insulating structure 13 with the first insulating layer 113 facing the insulating structure 13, thereby forming a first laminated board 10. The first insulating layer 113 and the insulating structure 13 combine to form a first dielectric layer 101. In the first laminated board 10, the first base region 11a is combined with the first surface 131, the first folding regions 11b are respectively bent to the side surfaces 133 and 134 to be combined with the side surfaces 133 and 134.

In at least one embodiment, the first folding regions 11b cover the whole side surfaces 133 and 134.

Figure 4:
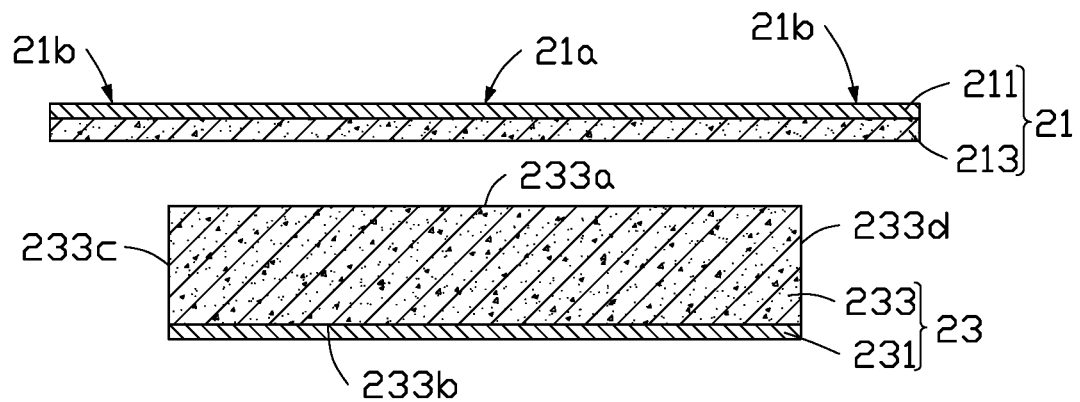
FIG. 4 is a cross-sectional view of an embodiment of a second single-sided board and a third single-sided board.

At block 803, referring to FIG. 4, a second single-sided board 21 and a third single-sided board 23 are provided. The second single-sided board 21 is divided into a second base region 21a and second folding regions 21b connecting opposite sides of the second base region 21a. The third single-sided board 23 corresponds to the second base region 21a.

In at least one embodiment, the second single-sided board 21 includes a second metal layer 211 and a second insulating layer 213 stacked on the second metal layer 211. The third single-sided board 23 includes a third metal layer 231 and a third insulating layer 233 stacked on the third metal layer 231. The third insulating layer 233 includes a top surface 233a and a bottom surface 233b facing away the top surface 233a, two side walls 233c and 233d opposite to each other. Each of the side walls 233c and 233d is connected to the top surface 233a and the bottom surface 233b. The third metal layer 231 is combined with the bottom surface 233b.

In at least one embodiment, a thickness of the second single-sided board 21 is less than a thickness of the third single-sided board 23.

Figure 5:
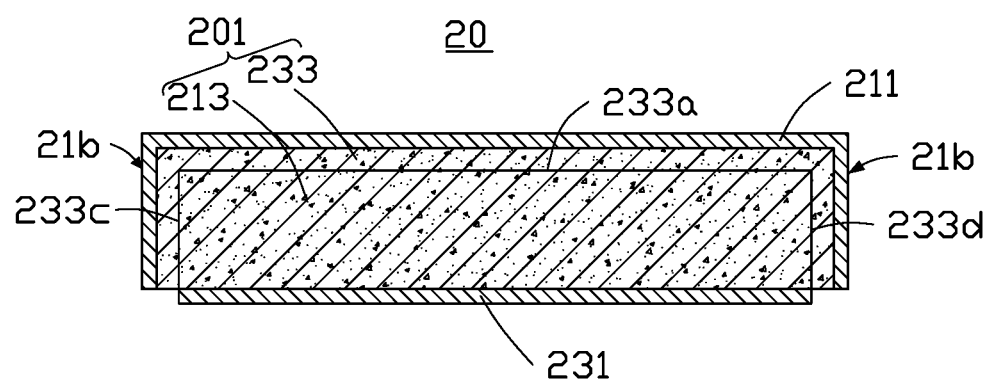
FIG. 5 is a cross-sectional view showing a second laminated board formed by the second single-sided board and the third single-sided board of FIG. 4.

At block 804, referring to FIG. 5, the second single-sided board 21 is pressed to the third insulating layer 233 with the second insulating layer 213 facing the third insulating layer 233, thereby forming a second laminated board 20. The second insulating layer 213 and the third insulating layer 233 combine to form a second dielectric layer 201. The second metal layer 211 and the third metal layer 231 cooperate to surround the second dielectric layer 201. The second base region 21a is combined with the top surface 233a. The second folding regions 21b are respectively bent to the side walls 233c and 233d to be combined with the side walls 233c and 233d.

In at least one embodiment, the second folding regions 21b cover the whole side walls 233c and 233d.

Figure 6:
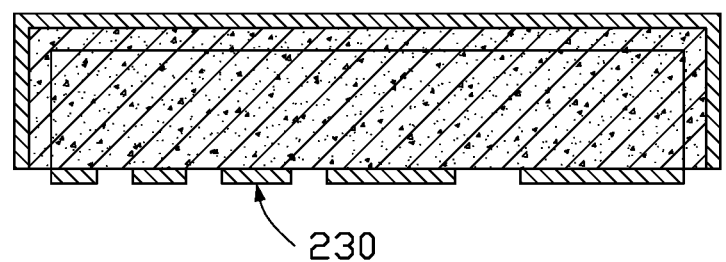
FIG. 6 is a cross-sectional view showing an inner wiring layer formed by the second laminated board of FIG. 5.

At block 805, referring to FIG. 6, an inner wiring layer 230 is formed by performing a circuit manufacturing process on the third metal layer 231 of the second laminated board 20.

Figure 7:
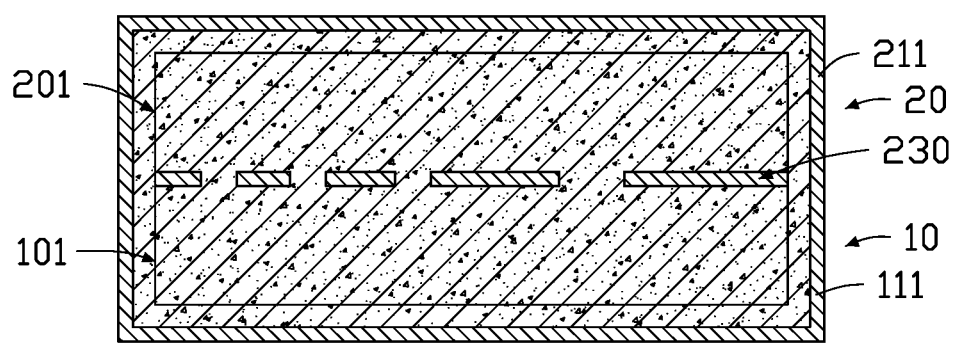
FIG. 7 is a cross-sectional view showing an intermediate structure formed by the second laminated board of FIG. 6 and the first laminated board of FIG. 3.

At block 806, referring to FIG. 7, the second laminated board 20 after the circuit manufacturing process and the first laminated board 10 are pressed together to form an intermediate structure 30. The inner wiring layer 230 is wrapped around by the first dielectric layer 101 and the second dielectric layer 201.

Figure 8A:
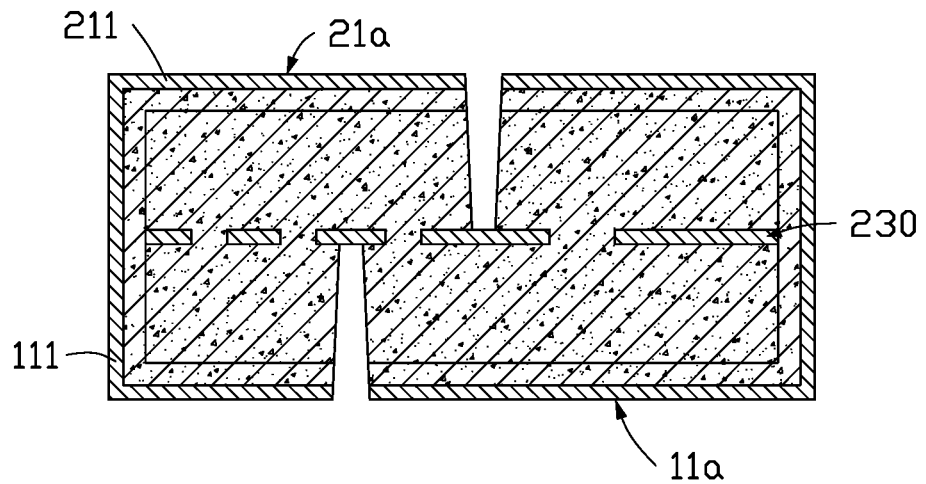
FIGS. 8A, 8B, and 8C are cross-sectional views of illustrating respective steps of a method for manufacturing outer wiring layers by the intermediate structure of FIG. 7.
Figure 8B:
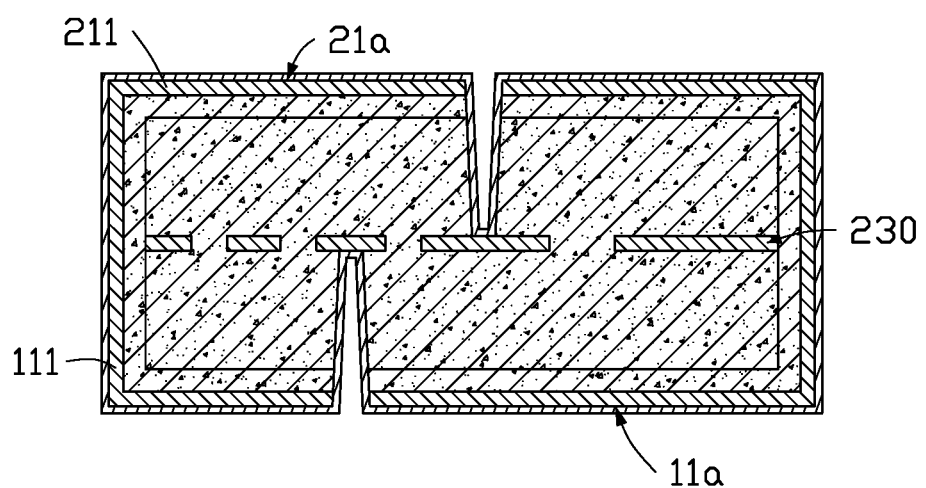
Figure 8C:
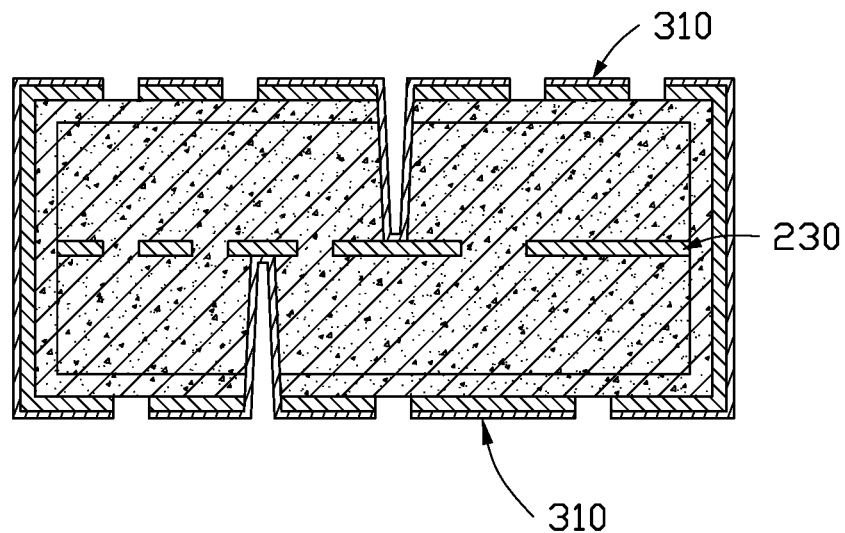

At block 807, referring to FIGS. 8A to 8C, outer wiring layers 310 are formed by a portion of the first metal layer 111 corresponding to the first base region 11a and a portion of the second metal layer 211 corresponding to the second base region 21a after performing a circuit manufacturing process on the intermediate structure 30. The outer wiring layers 310 electrically connect to the inner wiring layer 230.

Figure 9:
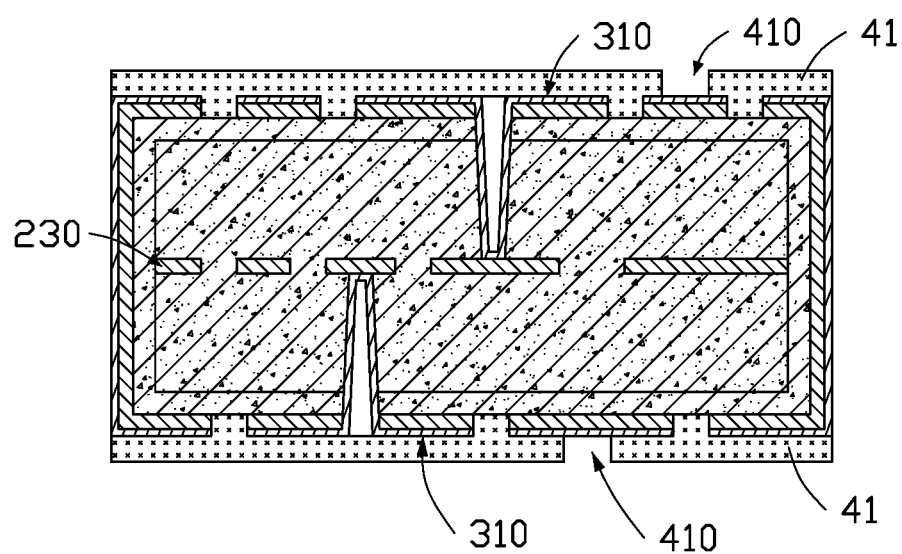
FIG. 9 is a cross-sectional view showing covering films on the outer wiring layers of FIG. 8C.

At block 808, referring to FIG. 9, covering films 41 are formed on surfaces of the outer wiring layers 310 facing away from the inner wiring layer 230. At least one opening 410 is formed on each of the covering films 41 to expose a portion of the outer wiring layers 310.

Figure 10:
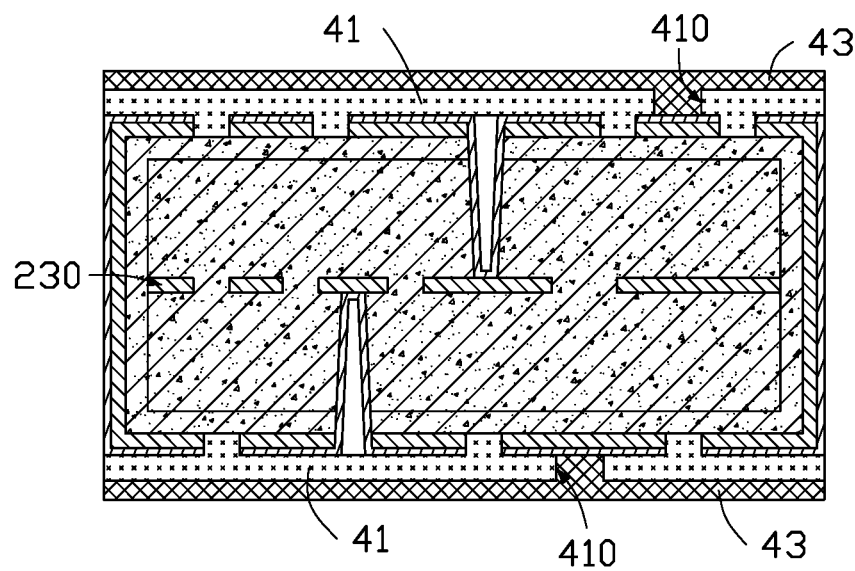
FIG. 10 is a cross-sectional view showing electromagnetic interference shielding layers on the covering films of FIG. 9.

At block 809, referring to FIG. 10, electromagnetic interference shielding layers 43 are formed on the covering films 41 and infill the at least one opening 410 to electrically connect to the outer wiring layers 310.

Figure 11:
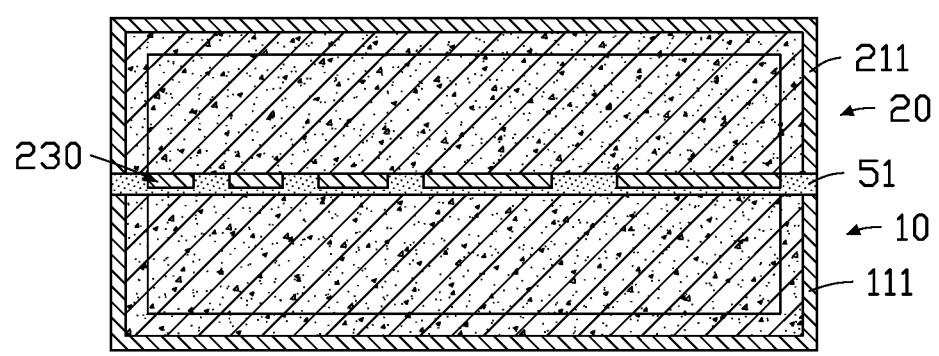
FIG. 11 is a cross-sectional view of a second embodiment of an intermediate structure.
Figure 12:
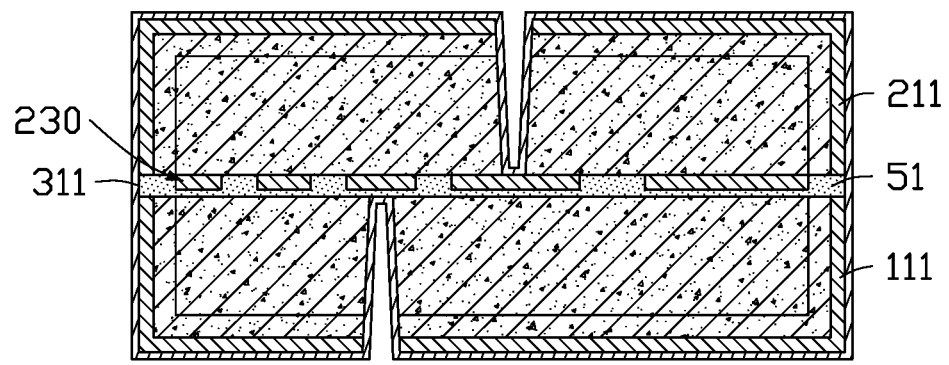
FIG. 12 is a cross-sectional view showing outer wiring layers formed by the intermediate structure of FIG. 11.
Figure 13:
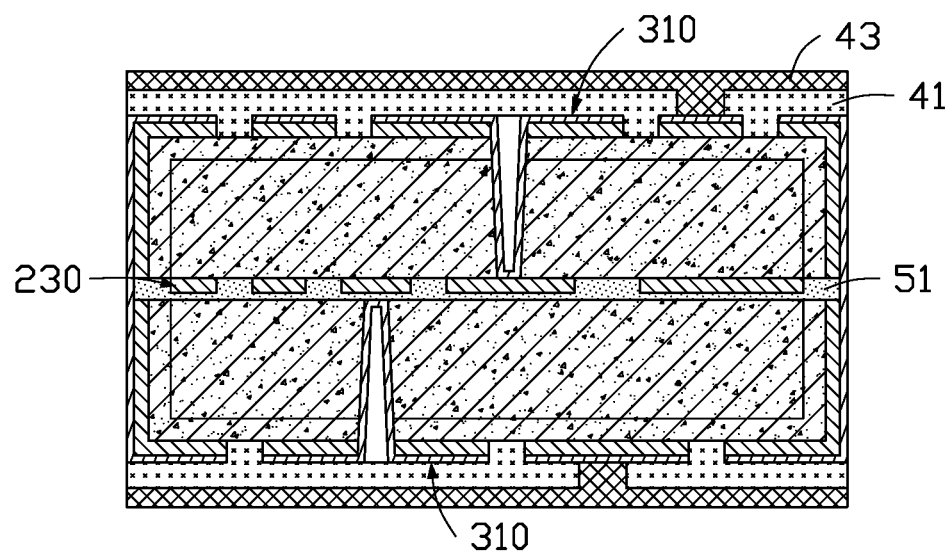
FIG. 13 is a cross-sectional view of a second embodiment of a circuit board.

A second embodiment differs from the first embodiment described above, referring to FIG. 11, when forming the intermediate structure 30 by pressing the first laminated board 10 and the second laminated board 20 together, a first adhesive layer 51 is sandwiched between the first laminated board 10 and the second laminated board 20. Referring to FIG. 12, when performing the circuit manufacturing process on the intermediate structure 30, deposited metal layers 311 are formed on end portions of the first adhesive layer 51 adjacent to the first folding regions 11b and the second folding regions 21b to connect the first metal layer 111 and the second metal layer 211. FIG. 13 illustrates a circuit board manufacturing by the method of the second embodiment.

Figure 14:
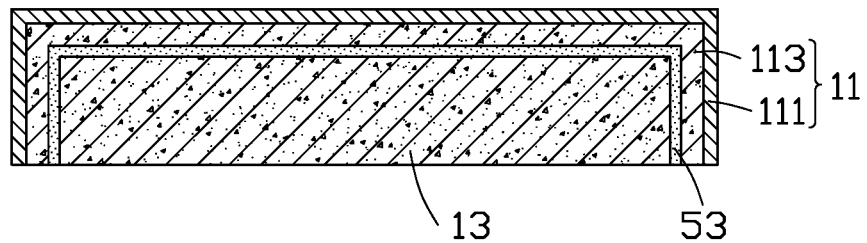
FIG. 14 is a cross-sectional view of a third embodiment of a first laminated board.
Figure 15:
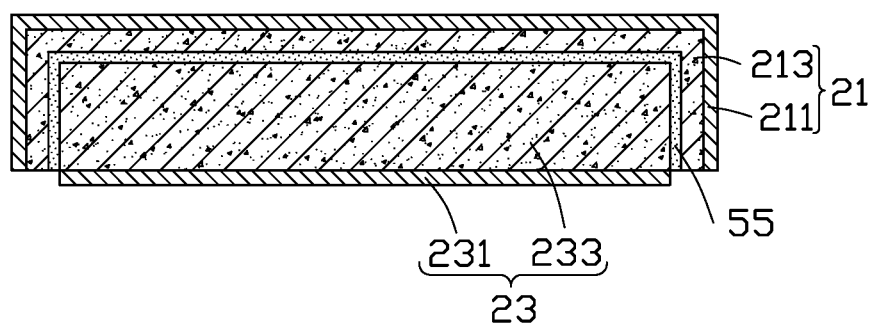
FIG. 15 is a cross-sectional view of the third embodiment of a second laminated board.
Figure 16:
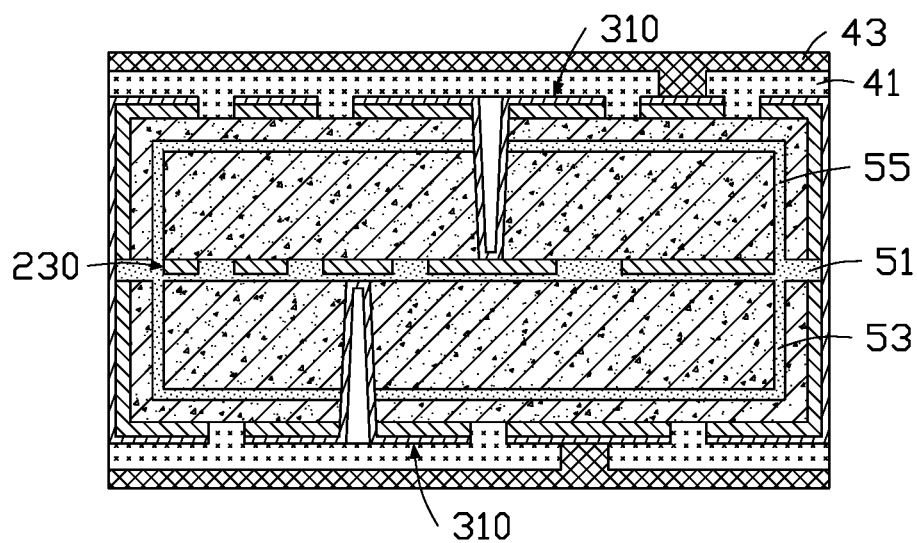
FIG. 16 is a cross-sectional view of the third embodiment of a circuit board.

A third embodiment differs from the second embodiment described above, referring to FIG. 14, when forming the first laminated board 10 by pressing the first single-sided board 11 to the insulating structure 13, a second adhesive layer 53 is sandwiched between the first single-sided board 11 and the insulating structure 13. Referring to FIG. 15, when forming the second laminated board 20 by pressing the second single-sided board 21 to the third insulating layer 233, a third adhesive layer 55 is sandwiched between the second single-sided board 21 and the third insulating layer 233. FIG. 16 illustrates a circuit board manufacturing by the method of the third embodiment.

Figure 17:
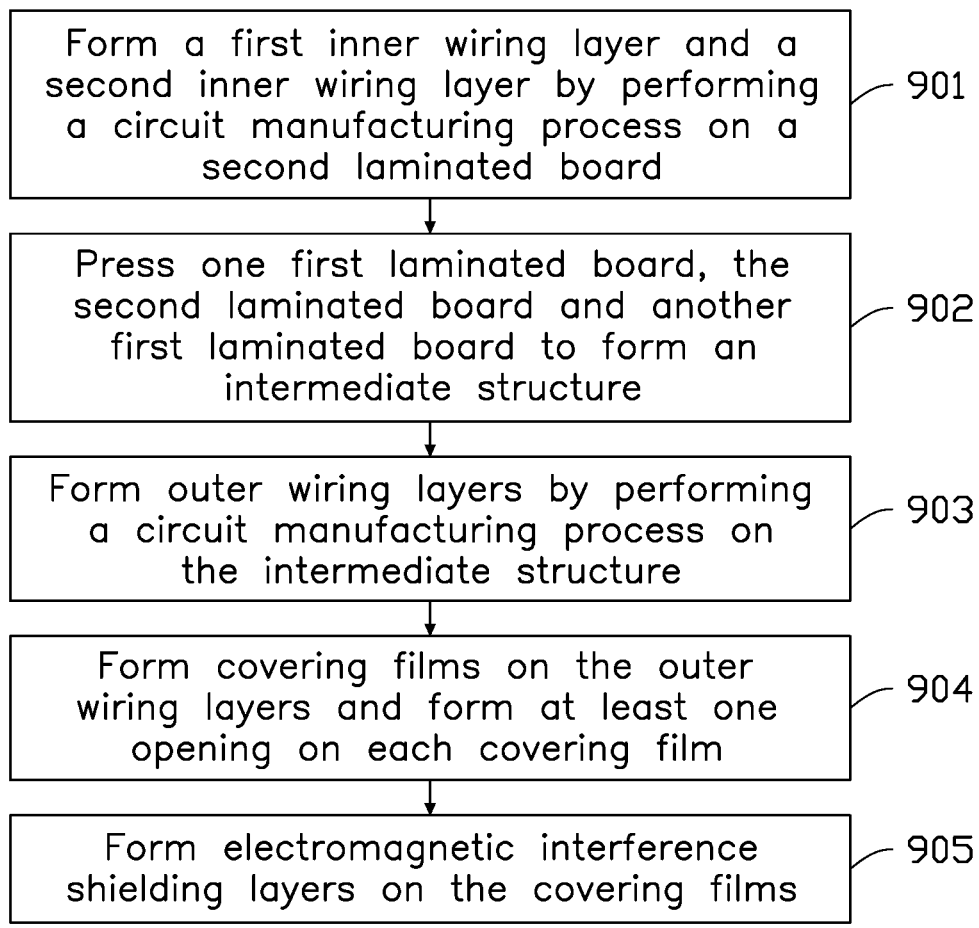
FIG. 17 is a flowchart of a fourth embodiment of a method for manufacturing a circuit board.

FIG. 17 illustrates a flowchart of a fourth embodiment of a method for manufacturing a circuit board. The method can begin at block 901.

At block 901, a second laminated board 20 as shown in FIG. 5 is provided, a first inner wiring layer 230a (shown in FIG. 18) is formed by performing a circuit manufacturing process on a portion of the second metal layer 211 corresponding to the second base region 21a of the second laminated board 20, and a second inner wiring layer 230b (shown in FIG. 18) is formed by performing a circuit manufacturing process on the third metal layer 231 of the second laminated board 20. The first inner wiring layer 230a electrically connects to the second inner wiring layer 230b.

Figure 18:
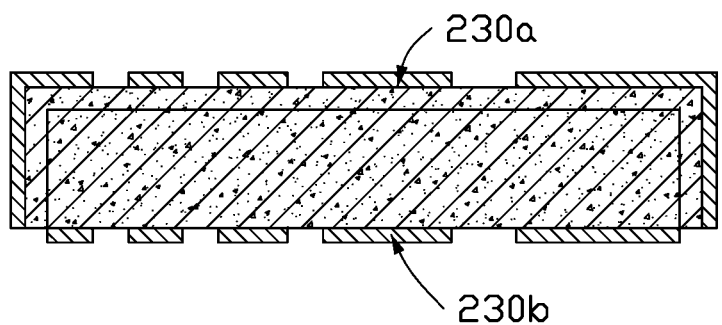
FIG. 18 is a cross-sectional view showing a first inner wiring layer and a second inner wiring layer formed by the second laminated board of FIG. 5.
Figure 19:
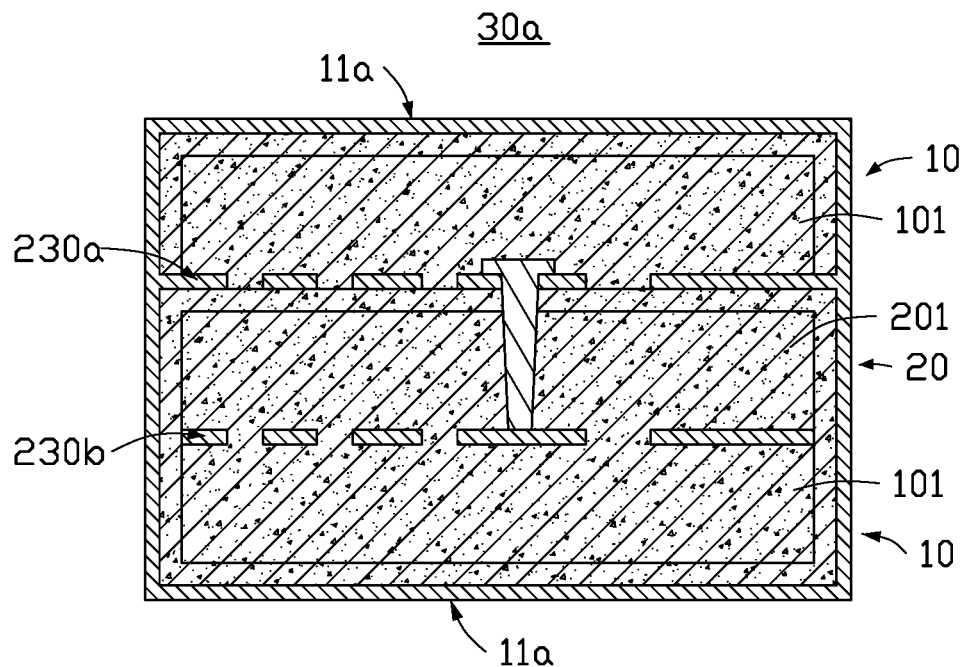
FIG. 19 is a cross-sectional view showing an intermediate structure formed by the first laminated boards of FIG. 3 and the second laminated board of FIG. 18.

At block 902, referring to FIG. 19, one first laminated board 10 as shown in FIG. 3, the second laminated board 20 as shown in FIG. 18, and another first laminated board 10 as shown in FIG. 3 are stacked in the order written and pressed together, thereby forming an intermediate structure 30a. The first inner wiring layer 230a is wrapped around by the second dielectric layer 201 and the first dielectric layer 101 of the one first laminated board 10, the second inner wiring layer 230b is wrapped around by the second dielectric layer 201 and the first dielectric layer 101 of the another first laminated board 10.

Figure 20:
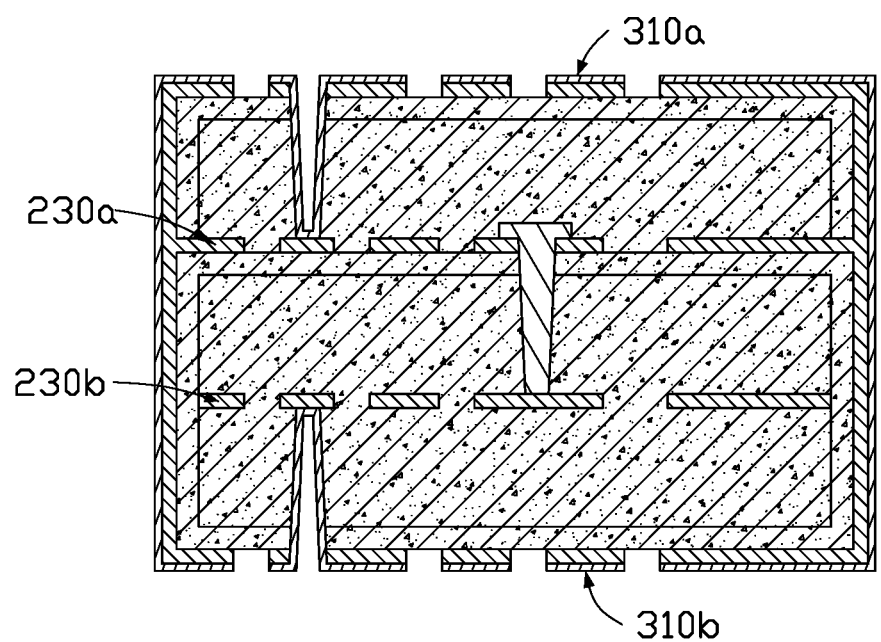
FIG. 20 is a cross-sectional view showing outer wiring layers formed by the intermediate structure of FIG. 19.

At block 903, referring to FIG. 20, outer wiring layers 310a are formed by a portion of each of the first metal layers 111 corresponding to the adjacent first base region 11a. The outer wiring layers 310a electrically connect to the first inner wiring layer 230a and the second inner wiring layer 230b.

Figure 21:
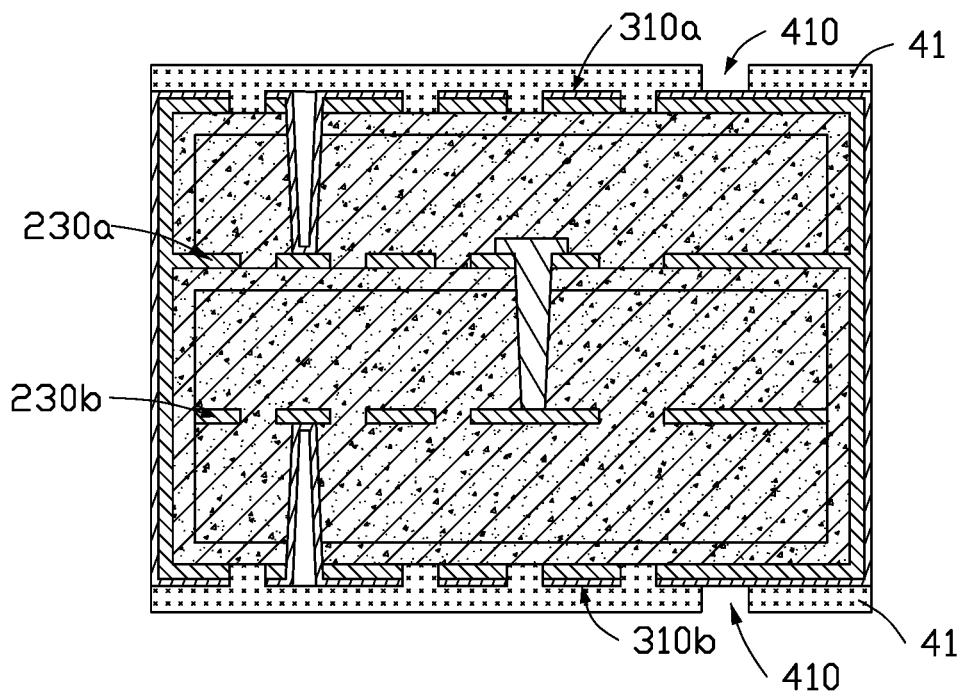
FIG. 21 is a cross-sectional view showing covering films on the outer wiring layers of FIG. 20.

At block 904, referring to FIG. 21, covering films 41 are formed on surfaces of the outer wiring layers 310a facing away from the first inner wiring layer 230a. At least one opening 410 is formed on each of the covering films 41 to expose a portion of the outer wiring layers 310a.

Figure 22:
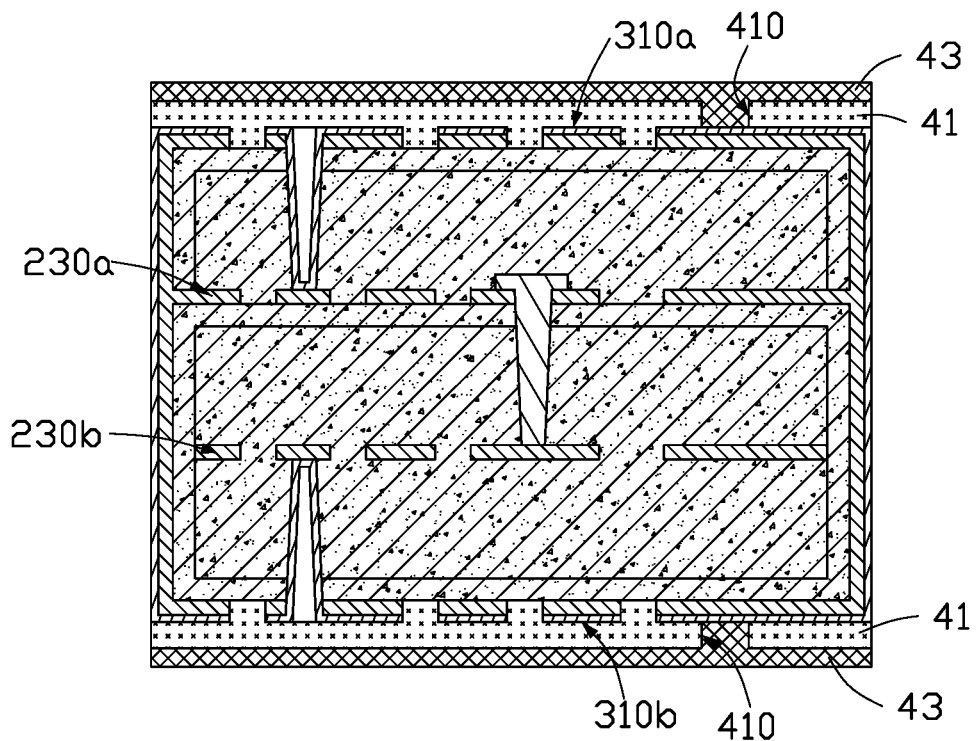
FIG. 22 is a cross-sectional view showing electromagnetic interference shielding layers on the covering films of FIG. 21.

At block 905, referring to FIG. 22, electromagnetic interference shielding layers 43 are formed on the covering films 41 and infill the at least one opening 410 to electrically connect to the outer wiring layers 310a.

Figure 23:
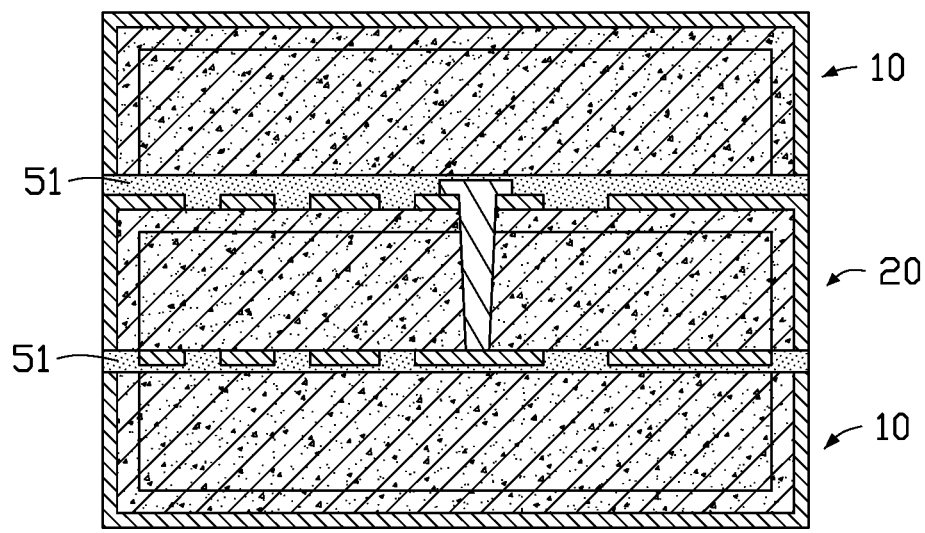
FIG. 23 is a cross-sectional view of a fifth embodiment of an intermediate structure.
Figure 24:
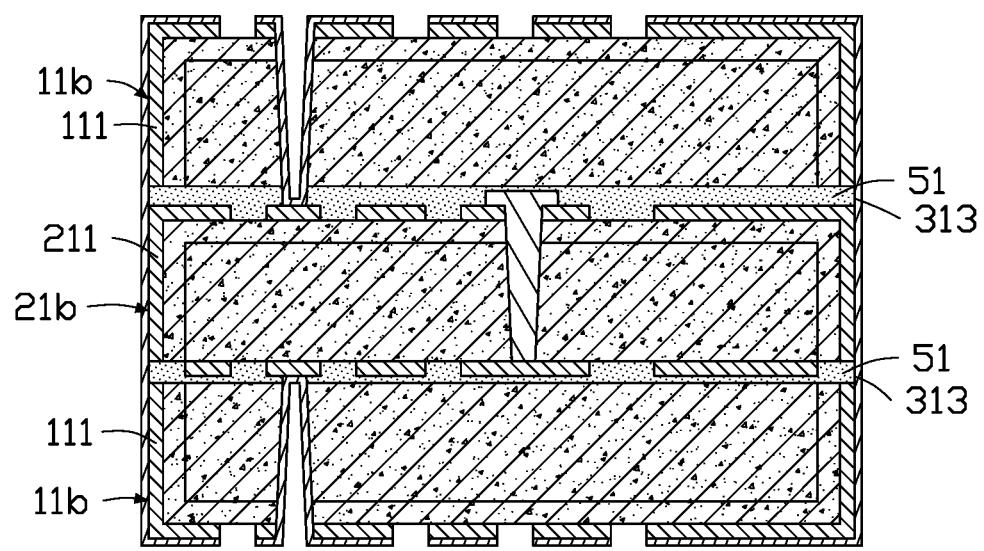
FIG. 24 is a cross-sectional view showing outer wiring layers formed by the intermediate structure of FIG. 23.
Figure 25:
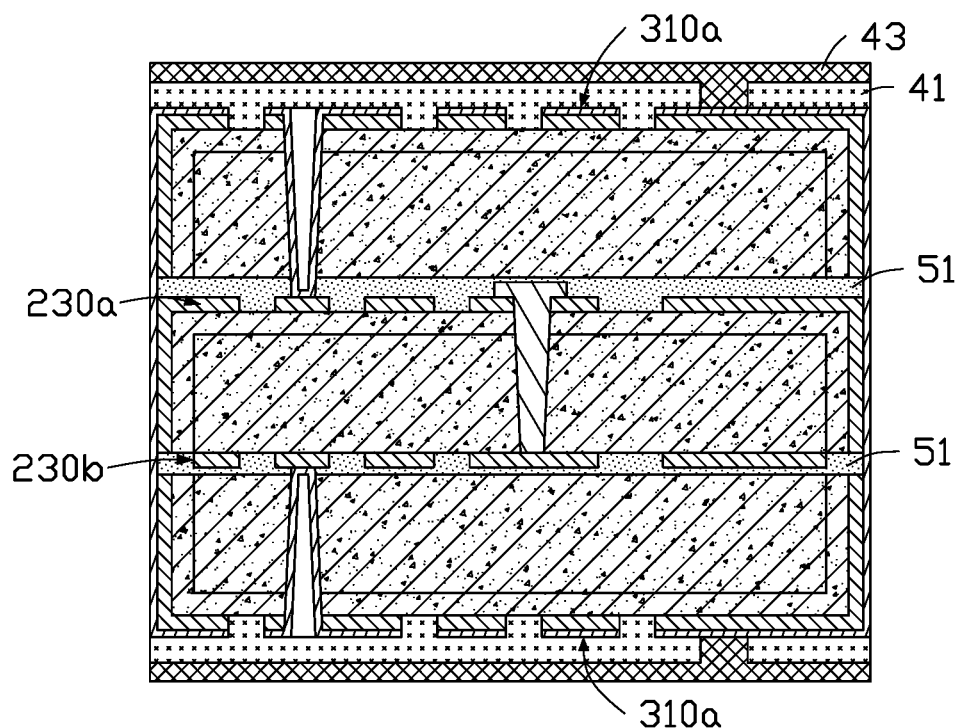
FIG. 25 is a cross-sectional view of the fifth embodiment of a circuit board.

A fifth embodiment differs from the fourth embodiment described above, referring to FIG. 23, when forming the intermediate structure 30a by pressing the one first laminated board 10, the second laminated board 20, and the another first laminated board 10 together, a first adhesive layer 51 is sandwiched between each of the first laminated boards 10 and the second laminated board 20. Referring to FIG. 24, when performing the circuit manufacturing process on the intermediate structure 30a, deposited metal layers 313 are formed on end portions of each of the first adhesive layers 51 adjacent to the first folding regions 11b and the second folding regions 21b to connect each of the first metal layers 111 and the second metal layer 211. FIG. 25 illustrates a circuit board manufacturing by the method of the fifth embodiment.

Figure 26:
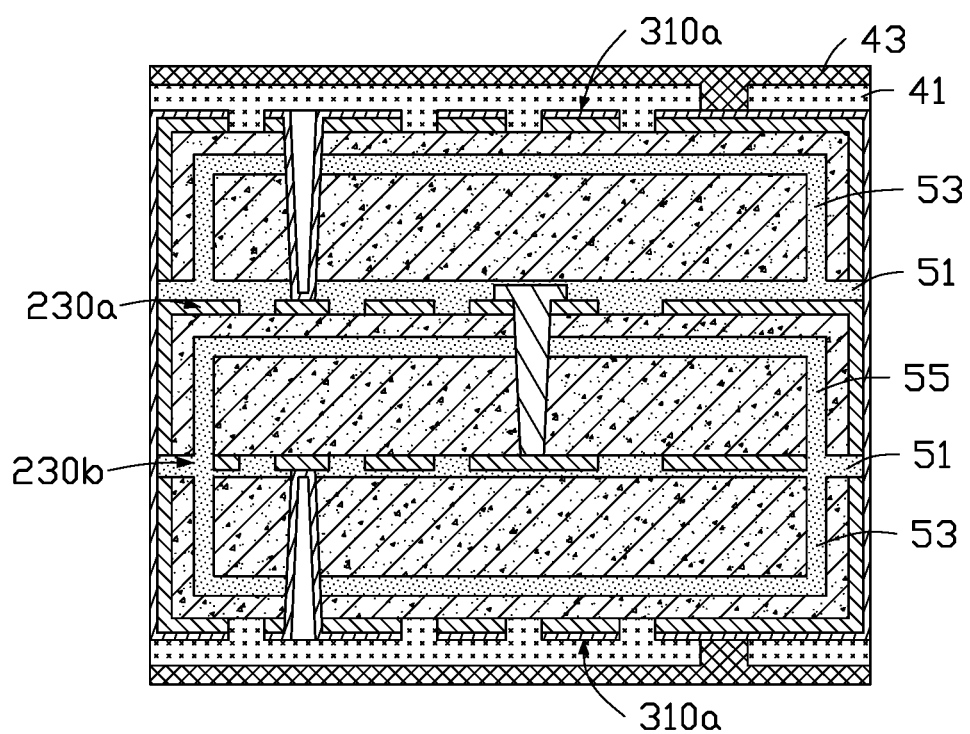
FIG. 26 is a cross-sectional view of a sixth embodiment of a circuit board.

A sixth embodiment differs from the fifth embodiment described above, referring to FIG. 14, when forming the first laminated board 10 by pressing the first single-sided board 11 to the insulating structure 13, a second adhesive layer 53 is sandwiched between the first single-sided board 11 and the insulating structure 13. Referring to FIG. 15, when forming the second laminated board 20 by pressing the second single-sided board 21 to the third insulating layer 233, a third adhesive layer 55 is sandwiched between the second single-sided board 21 and the third insulating layer 233. FIG. 26 illustrates a circuit board manufacturing by the method of the sixth embodiment.

The above methods for manufacturing the circuit board do not need to achieve the side electromagnetic interference shielding of the circuit board by providing shielding holes, thereby increasing the wiring space of the circuit board, and avoiding a risk of product defects caused by punching. In addition, the above methods for manufacturing the circuit board achieve the side electromagnetic interference shielding of the circuit board when pressing to build-up, and may more effectively prevent the side electromagnetic interference shielding structure from falling off than a simple method of side wall of the holes copper plating.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:
providing a first single-sided board and an insulating structure, wherein the first single-sided board is divided into a first base region and first folding regions connecting opposite sides of the first base region, the insulating structure comprises a first surface and two side surfaces connecting opposite sides of the first surface, the first single-sided board comprises a first metal layer and a first insulating layer stacked on the first metal layer;
pressing the first single-sided board to the insulating structure with the first insulating layer facing the insulating structure, thereby forming a first laminated board, wherein the first base region is combined with the first surface, the first folding regions are respectively bent to the two side surfaces to be combined with the two side surfaces, the first insulating layer and the insulating structure combine to form a first dielectric layer;
providing a second single-sided board and a third single-sided board, wherein the second single-sided board is divided into a second base region and second folding regions connecting opposite sides of the second base region, the second single-sided board comprises a second metal layer and a second insulating layer stacked on the second metal layer, the third single-sided board comprises a third metal layer and a third insulating layer stacked on the third metal layer, the third insulating layer comprises a top surface, a bottom surface facing away the top surface, and two side walls opposite to each other, each of the two side walls is connected to the top surface and the bottom surface, the third metal layer is combined with the bottom surface;
pressing the second single-sided board to the third insulating layer with the second insulating layer facing the third insulating layer, thereby forming a second laminated board, wherein the second base region is combined with the top surface, the second folding regions are respectively bent to the two side walls to be combined with the two side walls, the second insulating layer and the third insulating layer combine to form a second dielectric layer;
forming an inner wiring layer by the third metal layer of the second laminated board;
pressing the second laminated board with the inner wiring layer and the first laminated board to form an intermediate structure, wherein the inner wiring layer is wrapped around by the first dielectric layer and the second dielectric layer;
forming outer wiring layers by a portion of the first metal layer of the intermediate structure corresponding to the first base region and a portion of the second metal layer of the intermediate structure corresponding to the second base region, wherein the outer wiring layers electrically connect to the inner wiring layer;
forming covering films on surfaces of the outer wiring layers facing away from the inner wiring layer, and forming at least one opening on each of the covering films to expose a portion of the outer wiring layers;
forming electromagnetic interference shielding layers on the covering films, wherein the electromagnetic interference shielding layers infill the at least one opening on each of the covering films to electrically connect to the outer wiring layers.

2. The method of claim 1, wherein a thickness of the first single-sided board is less than a thickness of the insulating structure.

3. The method of claim 1, wherein a thickness of the second single-sided board is less than a thickness of the third single-sided board.

4. The method of claim 1, wherein the first folding regions cover the whole two side surfaces.

5. The method of claim 1, wherein the second folding regions cover the whole two side walls.

6. The method of claim 1, wherein when pressing the second laminated board with the inner wiring layer and the first laminated board to form the intermediate structure, a first adhesive layer is sandwiched between the second laminated board and the first laminated board; and when forming the outer wiring layers, deposited metal layers are formed on end portions of the first adhesive layer adjacent to the first folding regions and the second folding regions to connect the first metal layer and the second metal layer.

7. The method of claim 1, wherein when pressing the first single-sided board to the insulating structure with the first insulating layer facing the insulating structure, a second adhesive layer is sandwiched between the first single-sided board and the insulating structure; when pressing the second single-sided board to the third insulating layer with the second insulating layer facing the third insulating layer, a third adhesive layer is sandwiched between the second single-sided board and the third insulating layer.

* * * * *